(12) United States Patent  (10) Patent No.: US 7,591,659 B2
Chen et al.  (45) Date of Patent: Sep. 22, 2009

(54) METHOD AND STRUCTURE FOR SECOND SPACER FORMATION FOR STRAINED SILICON MOS TRANSISTORS

(75) Inventors: John Chen, Shanghai (CN); Xian J. Ning, Shanghai (CN); Hanming Wu, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 409 days.

(21) Appl. No.: 11/243,707

(22) Filed: Oct. 4, 2005

(65) Prior Publication Data

US 2007/0077716 A1  Apr. 5, 2007

(30) Foreign Application Priority Data

Sep. 19, 2005  (CN) ......................... 2005 1 0029992

(51) Int. Cl.
*H01L 21/8238* (2006.01)
(52) U.S. Cl. ...................... 439/199; 438/230; 438/231; 438/300
(58) Field of Classification Search .................. 438/199, 438/297, 230, 231, 300
See application file for complete search history.

(56) References Cited

U.S. PATENT DOCUMENTS

| | | | |
|---|---|---|---|
| 6,179,973 B1 | 1/2001 | Lai et al. | |
| 6,214,679 B1 * | 4/2001 | Murthy et al. | 438/299 |
| 6,251,242 B1 | 6/2001 | Fu et al. | |
| 6,277,249 B1 | 8/2001 | Gopalraja et al. | |
| 6,291,321 B1 | 9/2001 | Fitzgerald | |
| 6,346,729 B1 * | 2/2002 | Liang et al. | 257/344 |

(Continued)

FOREIGN PATENT DOCUMENTS

WO  WO 01/54175  7/2001

OTHER PUBLICATIONS

Belford et al., Performance-Augmented CMOS Using Back-end Uniaxial Strain, 2002 Device Research Conference, Santa Barbara, CA, 2 pages.

(Continued)

*Primary Examiner*—Michael Trinh
(74) *Attorney, Agent, or Firm*—Townsend and Townsend and Crew LLP

(57) ABSTRACT

A method for forming a CMOS semiconductor wafer. The method includes providing a semiconductor substrate (e.g., silicon wafer) and forming a dielectric layer (e.g., silicon dioxide, silicon oxynitride) overlying the semiconductor substrate. The method includes forming a gate layer overlying the dielectric layer and patterning the gate layer to form a gate structure including edges. The method includes forming a dielectric layer overlying the gate structure to protect the gate structure including the edges. Preferably, the dielectric layer has a thickness of less than 40 nanometers. The method includes etching a source region and a drain region adjacent to the gate structure using the dielectric layer as a protective layer and depositing silicon germanium material into the source region and the drain region to fill the etched source region and the etched drain region. The method causes a channel region between the source region and the drain region to be strained in compressive mode from at least the silicon germanium material formed in the source region and the drain region. The method includes forming a second protective layer overlying surfaces and performing an anisotropic etching process to form spacer structures to seal the gate structure.

18 Claims, 3 Drawing Sheets

U.S. PATENT DOCUMENTS

| | | | |
|---|---|---|---|
| 6,352,629 B1 | 3/2002 | Wang | |
| 6,406,599 B1 | 6/2002 | Subramani et al. | |
| 6,503,773 B2 | 1/2003 | Fitzgerald | |
| 6,514,836 B2 | 2/2003 | Belford | |
| 6,555,425 B2 * | 4/2003 | Huang et al. | 438/222 |
| 6,563,152 B2 | 5/2003 | Roberts et al. | |
| 6,730,196 B2 | 5/2004 | Wang et al. | |
| 6,812,073 B2 * | 11/2004 | Bu et al. | 438/151 |
| 7,135,724 B2 * | 11/2006 | Chen et al. | 257/288 |
| 2005/0035409 A1 * | 2/2005 | Ko et al. | 257/350 |

OTHER PUBLICATIONS

Comita et al., Low Temperature Si and SiGe Epitaxy for sub 01.μm Technology, AMAT Conference Paper, Mar. 10, 2003, 3 pages.

Chuang et al., Design Considerations of SOI Digital CMOS VLSI, Proceedings 1998 IEEE International SOI Conference, Oct. 1998, pp. 5-8.

Ge et al., Process-Strained Si (PSS) CMOS Technology Featuring 3D Strain Engineering, IEEE International Electron Devices Meeting, Washington, DC, Dec. 2003, 4 pages.

Thompson, Strained Silicon MOSFETs: The Next Material Change to Extend Moore's Law, University of Florida, Spring MRS 2004, pp. 1-36.

* cited by examiner

Recess Etch

US 7,591,659 B2

METHOD AND STRUCTURE FOR SECOND SPACER FORMATION FOR STRAINED SILICON MOS TRANSISTORS

CROSS-REFERENCES TO RELATED APPLICATIONS

This application claims priority to Chinese Patent Application No. 200510029992.1, filed on Sep. 19, 2005, commonly assigned, incorporated by reference herein for all purposes.

BACKGROUND OF THE INVENTION

The present invention is directed to integrated circuits and their processing for the manufacture of semiconductor devices. More particularly, the invention provides a method and structures for manufacturing MOS devices using strained silicon structures for advanced CMOS integrated circuit devices. But it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

An example of such a process is the manufacture of MOS devices itself. Such device has traditionally became smaller and smaller and produced faster switching speeds. Although there have been significant improvements, such device designs still have many limitations. As merely an example, these designs must become smaller and smaller but still provide clear signals for switching, which become more difficult as the device becomes smaller. Additionally, these designs are often difficult to manufacture and generally require complex manufacturing processes and structures. These and other limitations will be described in further detail throughout the present specification and more particularly below.

From the above, it is seen that an improved technique for processing semiconductor devices is desired.

BRIEF SUMMARY OF THE INVENTION

According to the present invention, techniques for processing integrated circuits for the manufacture of semiconductor devices are provided. More particularly, the invention provides a method and structures for manufacturing MOS devices using strained silicon structures for CMOS advanced integrated circuit devices. But it would be recognized that the invention has a much broader range of applicability.

In a specific embodiment, the present invention provides a method for forming a CMOS semiconductor wafer. The method includes providing a semiconductor substrate, e.g., silicon substrate. The method includes forming a dielectric layer (e.g., oxide, silicon oxynitride) overlying the semiconductor substrate. The method includes forming a gate layer (e.g., doped polysilicon layer) overlying the dielectric layer. The method includes patterning the gate layer to form a gate structure including edges and forming a dielectric layer overlying the gate structure to protect the gate structure including the edges. In a specific embodiment, the dielectric layer has a thickness of less than 40 nanometers, but can be other dimensions. The method includes forming sidewall spacer structures from a portion of the dielectric layer and etching a source region and a drain region adjacent to the gate structure using the sidewall spacer structures made from a portion of the dielectric layer as a protective layer. The method includes depositing silicon germanium material into the source region and the drain region to fill the etched source region and the etched drain region. The method causes a channel region between the source region and the drain region to be strained in compressive mode from at least the silicon germanium material formed in the source region and the drain region. The method includes forming a second protective layer overlying surfaces including the silicon germanium material and performing an anisotropic etching process to form spacer structures to seal the gate structure.

In an alternative specific embodiment, the invention provides a method for forming a CMOS semiconductor wafer. The method includes providing a semiconductor substrate (e.g., silicon wafer) and forming a dielectric layer (e.g., silicon dioxide, silicon oxynitride) overlying the semiconductor substrate. The method includes forming a gate layer overlying the dielectric layer and patterning the gate layer to form a gate structure including edges. The method includes forming a dielectric layer overlying the gate structure to protect the gate structure including the edges. Preferably, the dielectric layer has a thickness of less than 40 nanometers. The method includes etching a source region and a drain region adjacent to the gate structure using the dielectric layer as a protective layer and depositing silicon germanium material into the source region and the drain region to fill the etched source region and the etched drain region. The method causes a channel region between the source region and the drain region to be strained in compressive mode from at least the silicon germanium material formed in the source region and the drain region. The method includes forming a second protective layer overlying surfaces and performing an anisotropic etching process to form spacer structures to seal the gate structure.

In a specific embodiment, the present invention provides a method using a silicon germanium fill material, which has a larger lattice spacing than single crystal silicon material. Such larger lattice spacing of silicon germanium fill material causes a channel region of an MOS transistor to be in a slightly compressive mode, when such material has been deposited in recessed regions adjacent to the channel region. Although the lattice spacing is slightly larger, silicon germanium still grows within the recessed regions, which are substantially single crystal silicon bearing material. Of course, there may be other variations, medications, and alternatives.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the invention provides for an improved process integration for design rules of 90 nanometers and less. Additionally, the invention provides for increased mobility of holes using a strained silicon structure for CMOS devices. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

Figure 1:
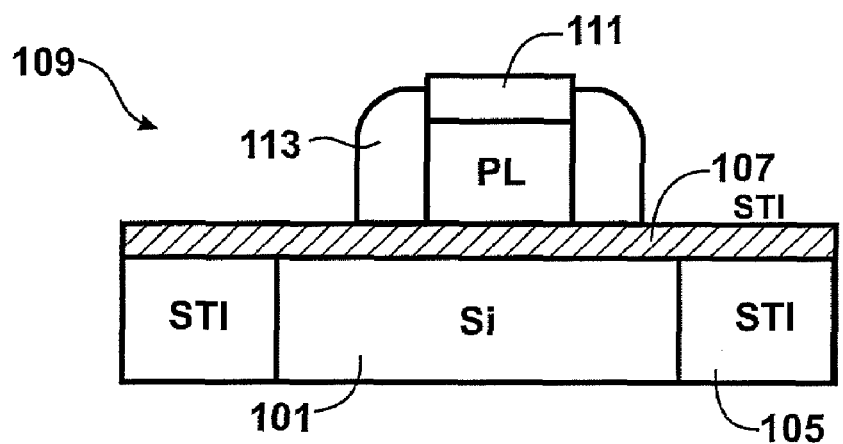
FIGS. 1 through 6 are simplified cross-sectional view diagram of a method for fabricating a CMOS device according to an embodiment of the present invention.

According to the present invention, techniques for processing integrated circuits for the manufacture of semiconductor devices are provided. More particularly, the invention provides a method and structures for manufacturing MOS devices using strained silicon structures for CMOS advanced integrated circuit devices. But it would be recognized that the invention has a much broader range of applicability.

A method for fabricating a CMOS integrated circuit device according to an embodiment of the present invention may be outlined as follows:

1. Provide a semiconductor substrate, e.g., silicon wafer, silicon on insulator;
2. Form a dielectric layer (e.g., gate oxide or nitride) overlying the semiconductor substrate;
3. Form a gate layer (e.g., polysilicon, metal) overlying the dielectric layer;
4. Pattern the gate layer to form a gate structure including edges (e.g., a plurality of sides or edges);
5. Form a dielectric layer (e.g. hard mask) overlying the gate structure to protect the gate structure including the edges;
6. Etch a source region and a drain region adjacent to the gate structure using the dielectric layer as a protective layer;
7. Deposit silicon germanium material into the source region and the drain region to fill the etched source region and the etched drain region;
8. Cause a channel region between the source region and the drain region to be strained in compressive mode from at least the silicon germanium material formed in the source region and the drain region, wherein the channel region is about the same width as the patterned gate layer;
9. Form sidewall spacers overlying the patterned gate layer;
10. Expose hard mask on the patterned gate layer;
11. Selectively remove the hard mask on patterned gate layer while maintaining the sidewall spacers overlying the patterned gate layer; and
12. Perform other steps, as desired.

The above sequence of steps provides a method according to an embodiment of the present invention. As shown, the method uses a combination of steps including a way of forming a CMOS integrated circuit device. Other alternatives can also be provided where steps are added, one or more steps are removed, or one or more steps are provided in a different sequence without departing from the scope of the claims herein. Further details of the present method can be found throughout the present specification and more particularly below.

FIGS. 1 through 6 are simplified cross-sectional view diagram of a method for fabricating a CMOS device according to an embodiment of the present invention. These diagrams are merely examples, which should not unduly limit the scope of the claims herein. One of ordinary skill in the art would recognize many variations, alternatives, and modifications. In a specific embodiment, the method forms a shallow trench isolation region or regions 105 within a portion of the semiconductor substrate 101. The shallow trench isolation regions are formed using patterning, etching, and deposition of a dielectric fill material within the trench region. The dielectric fill material is often oxide or a combination of oxide and nitride depending upon the specific embodiment. The isolation regions are used to isolate active regions within the semiconductor substrate.

The method forms a gate dielectric layer 107 overlying the surface of the substrate. Preferably, the gate dielectric layer is oxide or silicon oxynitride depending upon the embodiment. The gate dielectric layer is preferably 10-20 nanometers and less than 40 nanometers depending upon the specific embodiment. The method forms a gate layer overlying the semiconductor substrate. The gate layer is preferably polysilicon that has been doped using either in-situ doping or ex-situ implantation techniques. The impurity for doping is often boron, arsenic, or phosphorus having a concentration ranging from about $1\times10^{19}$ to about $1\times10^{20}$ atoms/cm$^3$. Of course, one of ordinary skill in the art would recognize many variations, modifications, and alternatives.

Preferably, the method forms a hard mask layer overlying the gate structure. The hard mask layer can be made of any suitable material such as a dielectric material or a metal material, or any combination of these. The hard mask layer is deposited to a suitable thickness to protect the underlying gate structure during etching and deposition steps, which will be further described below. In a specific embodiment, the present method forms sidewall spacers on edges of the patterned gate layer, as shown. The sidewall spacers are often made of a dielectric material, such as silicon dioxide, silicon nitride, or any combination of these, and the like As shown, the method patterned the gate layer to form an NMOS gate structure (not shown) including edges and patterns a PMOS gate structure 109 including edges. As shown, the hard mask 111 remains on the gate structure. The method forms lightly doped drain regions and sidewall spacers 113 on edges of patterned gate layer. The lightly doped drain regions are often formed using implantation techniques. For the PMOS device, the lightly doped drain region uses Boron or BF$_2$ impurity having a concentration ranging from about $1\times10^{18}$ to about $1\times10^{19}$ atoms/cm$^3$. For the NMOS device, the lightly doped drain region uses arsenic impurity having a concentration ranging from about $1\times10^{18}$ to about $1\times10^{19}$ atoms/cm$^3$. Depending upon the embodiment, the method forms a dielectric layer overlying the NMOS gate structure to protect the NMOS gate structure including the edges. The method also forms a dielectric protective layer overlying the PMOS gate structure to protect the PMOS gate structure including the edges. Preferably, the dielectric protective layer is the same layer for PMOS and NMOS devices. Alternatively, another suitable material can be used to protect the NMOS and PMOS gate structures, including lightly doped drain regions.

Figure 2:
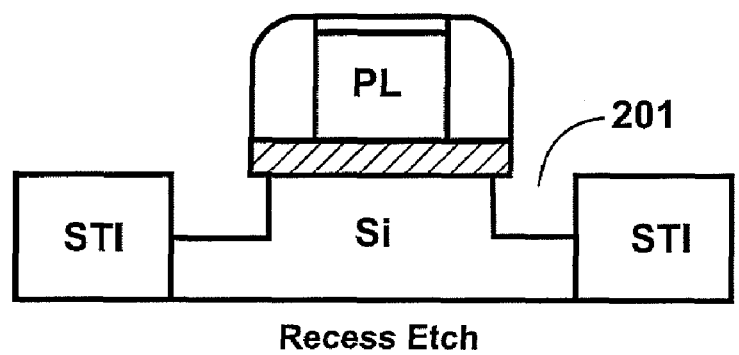

Referring to FIG. 2, the method simultaneously etches a first source region and a first drain region adjacent to the NMOS gate structure and etches a second source region and a second drain region 201 adjacent to the PMOS gate structure using the dielectric layer as a protective layer. The method uses reactive ion etching techniques including a $SF_6$ or $CF_4$ bearing species and plasma environment. In a preferred embodiment, the method performs a pre-treatment process on etched source/drain regions, which preserves the etched interfaces to maintain substantially high quality silicon bearing material. According to a specific embodiment, the each of the etched regions has a depth of ranging from about 100 Angstroms (Å) to about 1000 Å and a length of about 0.1 μm to about 10 μm, and a width of about 0.1 μm to about 10 μm for a 90 nanometer channel length. Each of the etched regions has a depth of ranging from about 100 Å to about 1,000 Å and a length of about 0.1 μm to about 10 μm, and a width of about 0.1 μm to about 10 μm for a 65 nanometer channel length according to an alternative specific embodiment. Preferably, the hard mask remains on the gate structure and does not expose any of the gate structure during the etching process.

Figure 3:
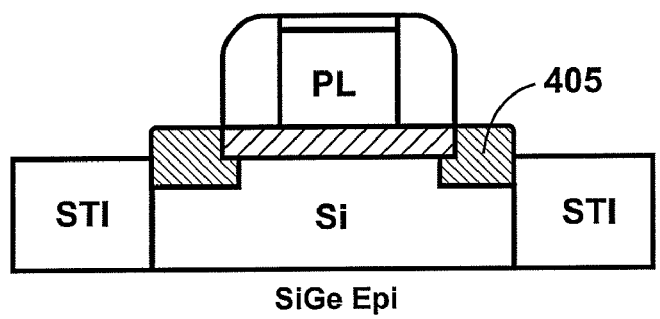

The method masks NMOS regions, while exposing the PMOS etched regions. Referring to FIG. 3, the method deposits silicon germanium material 405 into the first source region and the first drain region to cause a channel region between the first source region and the first drain region of the PMOS gate structure to be strained in a compressive mode. The silicon germanium is epitaxially deposited using in-situ doping techniques. That is, impurities such as boron are introduced while the silicon germanium material grows. A concentration ranges from about $1\times10^{19}$ to about $1\times10^{20}$ atoms/$cm^3$ of boron according to a specific embodiment. As shown, the hard mask 401 still remains in tact to selectively grow the silicon germanium material into the etched regions without depositing on the top of the gate structure. Of course, there can be other variations, modifications, and alternatives.

The method strips the mask from NMOS regions. The method masks PMOS regions, while exposing the NMOS etched regions. The method deposits silicon carbide material into the second source region and second drain region to cause the NMOS channel region between the second source region and the second drain region of the NMOS gate structure to be strained in a tensile mode. The silicon carbide is epitaxially deposited using in-situ doping techniques. That is, impurities such as phosphorous (P) or arsenic (As) are introduced while the silicon carbide material grows. A concentration ranges from about $1\times10^{19}$ to about $1\times10^{20}$ atoms/$cm^3$ of the above impurities according to a specific embodiment. Of course, there can be other variations, modifications, and alternatives.

Figure 4:
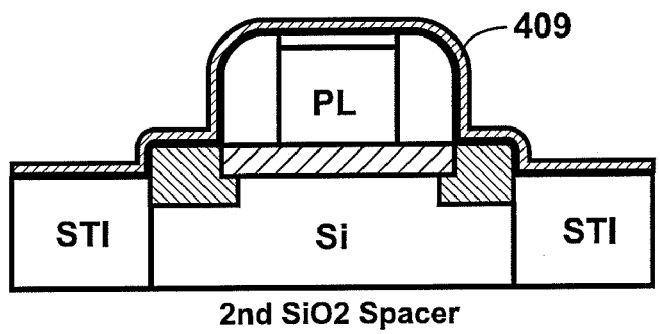
Figure 4A:
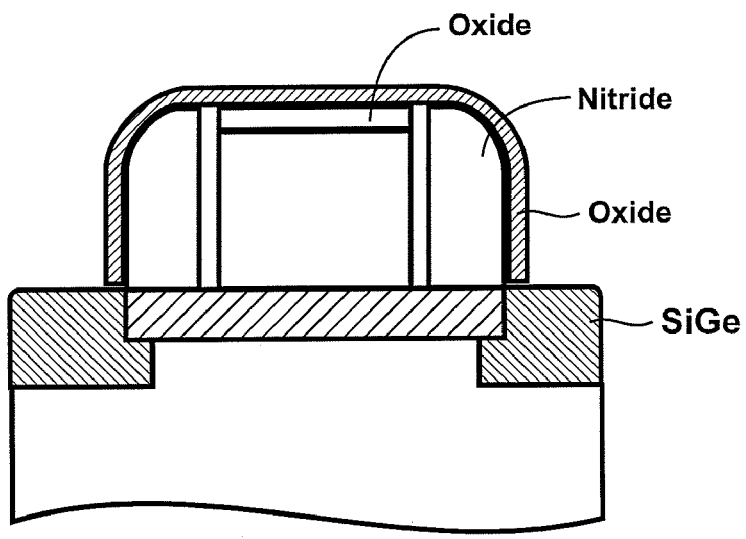
FIG. 4A is a simplified cross-sectional view structure of a double sidewall structure according to an embodiment of the present invention.

Referring to FIG. 4, the method includes depositing a protective layer 409 overlying the entirety of the patterned structure. The patterned structure includes silicon germanium fill material, shallow trench isolation, sidewall spacers, and hard mask material, and others depending upon the embodiment. The protective layer can be a silicon nitride layer, a silicon oxide layer, or any combination of these depending upon the specific embodiment. In a preferred embodiment, the protective layer seals phosphorous bearing impurities in the gate layer. In a preferred embodiment, protective layer comprises silicon nitride. Preferably, the final spacer structure comprises an ONO structure, as shown in FIG. 4A. The first oxide is about 200 Å, nitride 500 to 800 Å, second oxide 900 Å in the ONO, which is oxide on nitride on oxide structure. Depending upon the embodiment, the protective layer comprises PECVD oxide, or TEOS CVD, or thermal CVD, and others. Of course, one of ordinary skill in the art would recognize many variations, modifications, and alternatives.

Figure 5:
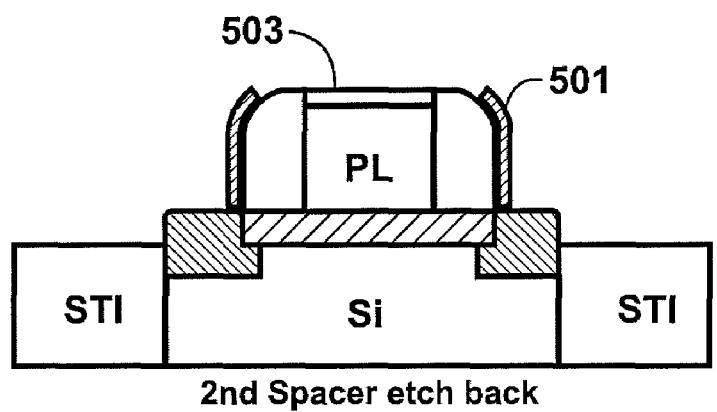
Figure 6:
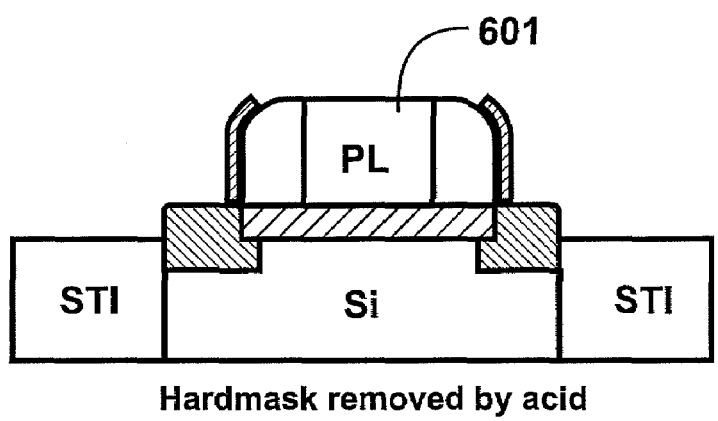

To finish the device according to an embodiment of the present invention, the method forms sidewall spacers 501 from the second protective layer, as illustrated by FIG. 5. The sidewall spacers exposes an upper portion 503 of the hard mask, while sealing regions on the edges of the gate layer. In a preferred embodiment, the method removes the hard mask to expose 601 the top surface of the gate structures, as shown in FIG. 6. Such gate structures are substantially free from any silicon germanium and/or silicon carbide bearing impurities. The gate structures are also substantially smooth and damage free. The method forms a silicide layer overlying gate layer and source/drain regions. Preferably, the silicide layer is a nickel bearing layer such as nickel silicide overlying the exposed source/drain regions and upper surface of the patterned gate layer. Other types of silicide layers can also be used. Such silicide layers include titanium silicide, tungsten silicide, nickel silicide, and the like. The method forms an interlayer dielectric layer overlying NMOS and PMOS transistor devices. The method then performs electrical contacts. Other steps include performing a back end processes and other steps, as desired.

The above sequence of steps provides a method according to an embodiment of the present invention. As shown, the method uses a combination of steps including a way of forming a CMOS integrated circuit device. In a preferred embodiment, the method provides a protective layer that is used for protecting a top portion of the gate structure during etching of recessed regions and selectively depositing silicon germanium material and/or silicon carbide material only on exposed surfaces of the recessed source/drain regions. Other alternatives can also be provided where steps are added, one or more steps are removed, or one or more steps are provided in a different sequence without departing from the scope of the claims herein.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for forming a CMOS semiconductor wafer comprising:

providing a semiconductor substrate;

forming a dielectric layer overlying the semiconductor substrate;

forming a gate layer overlying the dielectric layer;

patterning the gate layer to form a gate structure including edges;

forming a dielectric layer overlying the gate structure to protect the gate structure including the edges, the dielectric layer having a thickness of less than 40 nanometers;

etching a source region and a drain region adjacent to the gate structure using the dielectric layer as a protective layer;

depositing silicon germanium material into the source region and the drain region to fill the etched source region and the etched drain region;

causing a channel region between the source region and the drain region to be strained in compressive mode from at least the silicon germanium material formed in the source region and the drain region;

forming a second protective layer overlying surfaces including the silicon germanium material and an entirety of the gate structure to seal any impurities in the patterned gate layer, wherein the second protective layer is formed after the silicon germanium material is formed in the source region and the drain region; and performing an anisotropic etching process on the second protective layer to form spacer structures to seal the gate structure, wherein the spacer structures are formed after the silicon germanium material is formed in the source region and the drain region; and exposing a top surface of the gate structure while sealing the edges of the gate structure using the spacer structures, wherein the exposing occurs after formation of the spacer structures.

2. The method of claim 1 wherein the effective channel region has a length of a width of the gate structure.

3. The method of claim 1 wherein the semiconductor substrate is essential silicon material.

4. The method of claim 1 wherein the silicon germanium material is single crystalline.

5. The method of claim 1 further comprising forming a spacer layer overlying the semiconductor substrate including silicon germanium, gate structure, and edges.

6. The method of claim 5 further comprising anisotropic etching the spacer layer to form sidewall spacers on edges of the gate layer.

7. The method of claim 1 wherein the second protective layer seals phosphorous bearing impurities in the gate layer.

8. The method of claim 1 wherein the depositing of the silicon germanium material is provided using an epitaxial reactor.

9. The method of claim 1 wherein the compressive mode in the PMOS device increases a mobility of holes in the channel region.

10. The method of claim 1 wherein the second protective layer comprises silicon nitride.

11. The method of claim 1 wherein the spacer structures comprise an ONO structure.

12. The method of claim 11 wherein the ONO structure comprises first oxide of about 200 Å, nitride of about 500 to 800 Å, and second oxide of about 900 Å.

13. The method of claim 1 wherein the second protective layer comprises PECVD oxide.

14. The method of claim 1 wherein the second protective layer comprises TEOS CVD.

15. The method of claim 1 wherein the second protective layer comprises thermal CVD.

16. The method of claim 1 wherein the second protective layer comprises LPCVD.

17. The method of claim 1 wherein the second protective layer comprises ALD nitride.

18. A method for forming a CMOS semiconductor wafer comprising:

providing a semiconductor substrate;

forming a dielectric layer overlying the semiconductor substrate;

forming a gate layer overlying the dielectric layer, the gate layer comprises a plurality of impurities therein;

patterning the gate layer to form a gate structure including edges;

forming a dielectric layer overlying the gate structure to protect the gate structure including the edges, the dielectric layer having a thickness of less than 40 nanometers;

forming first sidewall spacer structures from a portion of the dielectric layer;

etching a source region and a drain region adjacent to the gate structure using the first sidewall spacer structures;

depositing silicon germanium material into the source region and the drain region to fill the etched source region and the etched drain region;

causing a channel region between the source region and the drain region to be strained in compressive mode from at least the silicon germanium material formed in the source region and the drain region;

forming a second protective layer overlying surfaces including the silicon germanium material and an entirety of the gate structure to seal any impurities in the patterned gate layer, wherein the second protective layer is formed after the silicon germanium material is formed in the source region and the drain region; and performing an anisotropic etching process on the second protective layer to form second sidewall spacer structures to seal the gate structure, wherein the second spacer structures are formed after the silicon germanium material is formed in the source region and the drain region; and exposing a top surface of the gate structure while sealing the edges of the gate structure using the second sidewall spacer structures, wherein the exposing occurs after formation of the second sidewall spacer structures.

* * * * *